United States Patent
Emery

(10) Patent No.: US 6,537,109 B1
(45) Date of Patent: Mar. 25, 2003

(54) CHAINABLE I/O TERMINATION BLOCK SYSTEM

(75) Inventor: Keith Emery, San Diego, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/556,768

(22) Filed: Apr. 24, 2000

Related U.S. Application Data

(63) Continuation-in-part of application No. 09/219,659, filed on Dec. 23, 1998, now Pat. No. 6,077,125, which is a continuation of application No. 08/783,852, filed on Jan. 16, 1997, now Pat. No. 5,897,399.

(51) Int. Cl.[7] .............................................. H01R 25/00
(52) U.S. Cl. .................... 439/638; 340/825.52; 439/928
(58) Field of Search ................................. 439/638, 502, 439/928; 340/825.52, 825.49; 710/100

(56) References Cited

U.S. PATENT DOCUMENTS

| | | | |
|---|---|---|---|
| 2,502,658 A | | 4/1950 | Lindmark |
| 4,253,087 A | * | 2/1981 | Saal ....................... 340/825.52 |
| 4,443,866 A | * | 4/1984 | Burgiss, Sr. ................. 710/100 |
| 4,520,429 A | | 5/1985 | Hosking |
| 4,626,846 A | * | 12/1986 | Parker .................... 340/825.52 |
| 4,658,375 A | * | 4/1987 | Onogi ........................ 439/928 |
| 4,782,245 A | | 11/1988 | Henry |
| 4,878,860 A | | 11/1989 | Matsuoka |
| 5,160,276 A | * | 11/1992 | Marsh et al. ................ 439/502 |
| 5,276,443 A | | 1/1994 | Gates et al. |
| 5,495,421 A | * | 2/1996 | Hidding ....................... 700/213 |
| 5,615,106 A | * | 3/1997 | Yoshino et al. ................ 710/9 |
| 5,775,955 A | * | 7/1998 | Graube et al. .............. 439/928 |
| 5,897,399 A | * | 4/1999 | Emery ......................... 439/709 |
| 6,028,865 A | * | 2/2000 | Rushe et al. ................. 370/419 |
| 6,075,704 A | * | 6/2000 | Amberg ....................... 361/736 |
| 6,174,196 B1 | * | 1/2001 | Pongracz et al. ........... 439/502 |

OTHER PUBLICATIONS

Vol. 34, 1995–1996 Buyer's Guide By Daniel Woodhead, entitled "Your Worldwide Source For Quality Electrical Solutions".

* cited by examiner

*Primary Examiner*—Neil Abrams
(74) *Attorney, Agent, or Firm*—Robert C. Sismilich

(57) ABSTRACT

A chainable I/O termination block system for connecting a programmable logic controller (PLC) or other controller to I/O signals such as sensors and control relays in an automatic tooling environment. A number of modular termination blocks (20) can be conveniently chained together to provide the required number of I/O points (28) at the appropriate location on the automated tool while simultaneously providing a single connection to the PLC (10). Chainable termination blocks (20) can be connected together directly or can be distributed over the required distance using block-to-block cabling (13). An autoshifting arrangement within each chainable termination block (20) determines the bit position at the controller (10) of each I/O signal (28). Each termination block (20) has at least one termination connector (21) for making the I/O connections to the automated tool, a PLC-side chaining connector (26) for connecting to the PLC (10) or to termination blocks (20) closer in the chain to the PLC (10), and an I/O-side chaining connector (24) for connecting to additional termination blocks (20) further down the chain away from the PLC (10). In each chainable termination block (20) remote signal lines are to be shifted and replaced by local signal lines while ground and power lines remain unshifted.

17 Claims, 9 Drawing Sheets

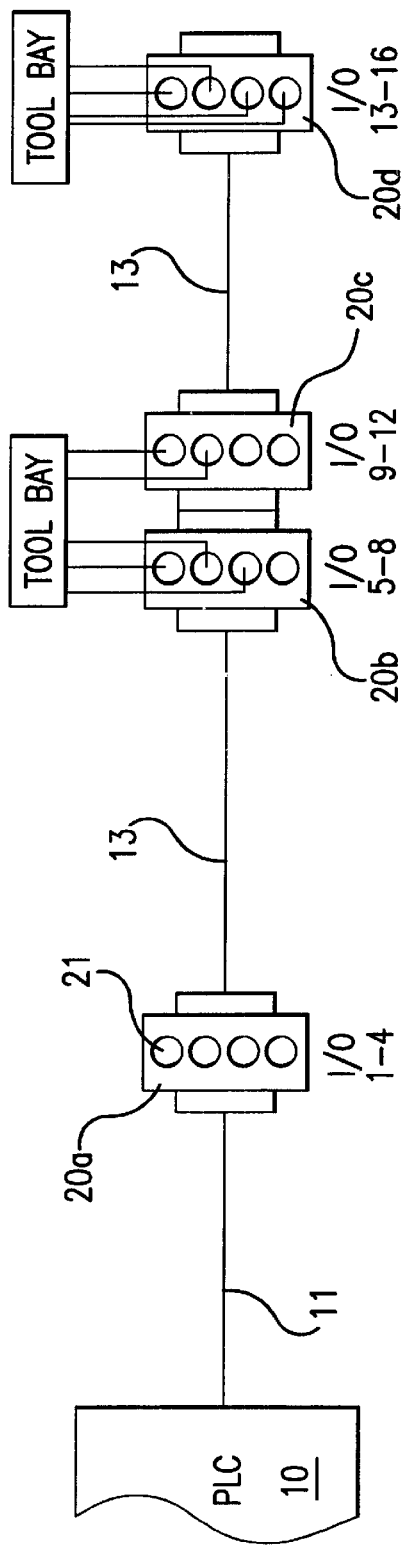
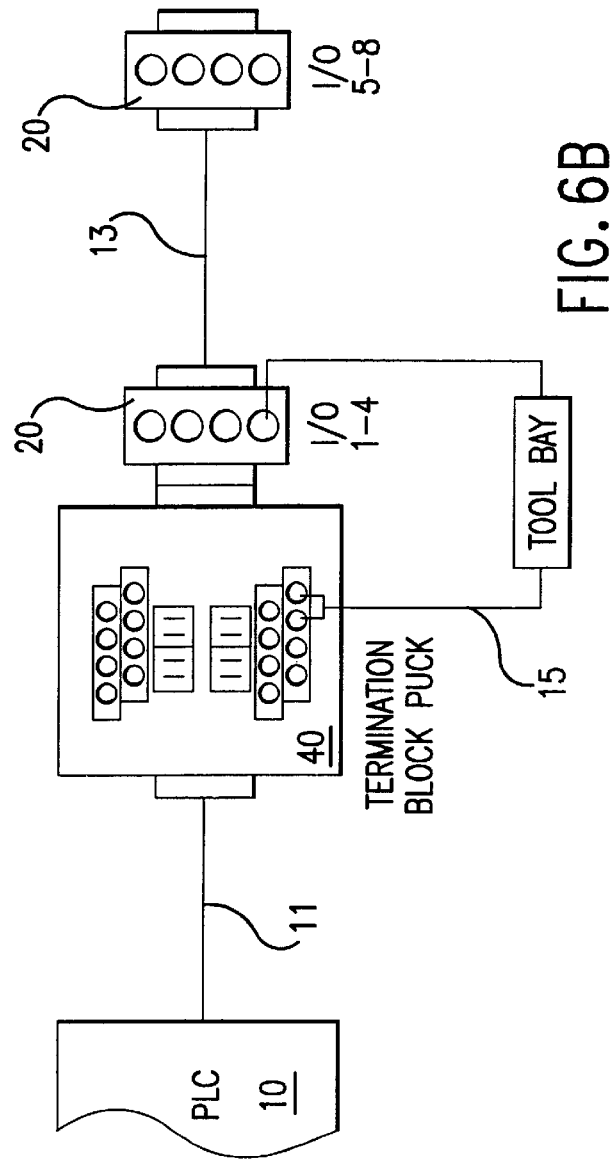
FIG. 6A
FIG. 6B

CHAINABLE I/O TERMINATION BLOCK SYSTEM

CROSS-REFERENCE TO RELATED APPLICATIONS

This application is a continuation-in-part of the U.S. application Ser. No. 09/219,659, now U.S. Pat. No. 6,077,125, by Emery, filed Dec. 23, 1998, titled "Versatile Input/Output Control and Power Distribution Block for Use With Automated Tooling", which is in turn a continuation of U.S. application Ser. No. 08/783,852, now U.S. Pat. No. 5,897,399, by Emery, filed Jan. 16, 1997, titled "Versatile Input/Output Control and Power Distribution Block for Use With Automated Tooling". This application also relates to the subject matter disclosed in the co-pending U.S. application Ser. No. 09/556,507, by Emery et al., filed concurrently herewith, titled "Submersible Sensor Output Inverter". All of these applications are assigned to the assignee of the present invention and are hereby incorporated by reference in their entirety.

FIELD OF THE INVENTION

The present invention relates generally to automated tooling, and pertains more particularly to a versatile input/output control and power distribution block for use with automated tooling.

BACKGROUND OF THE INVENTION

When using automated tooling, a programmable logic controller or computer is often required to send output control signals to, and receive input sensor signals from, a number of automated tools. Typically the connection to each automated tool consists of three wires: a wire which carries a ground signal, a wire which carries a power signal, and a wire which carries an input/output (I/O) signal which either is a control signal that is output from the controller to the automated tool, or a sensor signal from the automated tool that is input to the controller.

The connections from the automated tools are typically terminated at a termination block. At the termination block, the ground signals and the power signals connected to the automated tools are combined respectively. The termination block passes the control signals and the sensor signals between the programmable logic controller or computer and the individual automated tools.

The three individual wires from each automated tool sensor or control, grouped together in a cable, have typically been connected to a terminator block using wire leads held in individual wire receptacles. However, when automation tools are used in production, this mechanical arrangement frequently results in the sensor cables being subject to repetitive motion. Over the course of time, this can result in the wires within the cables becoming intermittently or permanently defective. In addition, replacement of I/O cables with wire leads held in individual wire receptacles can be time consuming.

To alleviate this problem, some manufacturers have utilized I/O cables with connectors which can be plugged into a termination block. This has provided for an easier replacement of defective cables. However, existing units which utilize these types of connectors typically can connect to no more than eight I/O connector cables, and are not backward compatible with automated tools which require the use of pull-up/down resistors or which have wires with flying leads.

In addition, programmable logic controllers typically provide a number of input/output lines, frequently sixteen, packaged in a single I/O module. As a result, it would be most efficient to connect a single I/O cable from the controller to a termination block of the corresponding size. However, it is not infrequent that an automated tool occupies a relatively large physical area, such as a number of different bays of equipment, with clusters of input/output connections of fewer than sixteen lines spaced dozens or even hundreds of feet away from each other. As a result, in order to make full use of all the lines in the controller's I/O module, a number of separate wires will need to run a relatively long distance to the proper area of the tool. It would be a far more robust arrangement with more optimal interconnect wiring the appropriate I/O connections could be provided in the desired areas of the tool, while still allowing simple and reliable cabling from the controller to the termination block.

SUMMARY OF THE INVENTION

In a preferred embodiment, the present invention provides a modular, distributable termination system for an automated tooling arrangement that is easy to wire and physically robust. The termination system has at least one chainable termination puck with at least one termination connector which provides a total of (L) local signal lines for connection to I/O devices of the automated tooling. The puck also has an I/O-side chaining connector with a total of (N–L) remote signal lines, and a PLC-side chaining connector with a total of (N) lines which is electrically connected to the (L) local signal lines and the (N–L) remote signal lines. The signals are arranged on the two chaining connectors such that the remote signal lines are shifted in position on the PLC-side chaining connector relative to the I/O-side chaining connector by the number (L) of local signal lines, and replaced in position by the local signal lines. In the preferred embodiment, N=16, and L=2, 4, or 8. The I/O-side chaining connector of one chainable termination puck is electrically engageable with the PLC-side chaining connector of an additional chainable termination puck, thus providing the desired modularity in terms of the number of I/O connections. The two chaining connectors are complementary such that they can be mechanically mated with each other when additional I/O points are required in the same area, or they can be connected using an electrical cable assembly so that the I/O points can be distributed to the areas of the tool that require them. In the preferred embodiment, the termination connector is a DIN connector, while the two chaining connectors are the same type of connector having the same number of pins but a different gender, typically mail and female 25 pin female D-sub connectors. The puck also has power and ground lines on the first and second chaining connectors and the termination connectors which are used to supply power from the controller to I/O devices connected to the termination connectors.

An alternate embodiment of the termination system includes a termination block puck which has two chaining connectors and multiple I/O device connectors, of a type different from the termination connectors. The termination block puck also has multiple switches for selecting either a line from the chaining connector or a line from one of the I/O device connectors to be electrically connected to a line of the second main connector.

The present invention may also be implemented as a method for distributing a linearly ordered group of input/output lines from a controller to input/output devices. Such a method includes receiving a first linearly ordered group, connecting the lines in a local subgroup adjacent a first end of the first linearly ordered group to at least one termination connector, shifting the lines in a remote subgroup comprising the remaining input/output lines in a direction toward the first end so as to form a second linearly ordered group, and providing the second linearly ordered group to an external device. Both linearly ordered groups have the same number of lines. Some embodiments further include electrically connecting the first termination puck to the controller, and electrically connecting the first termination puck to a second termination puck. The first linearly ordered group can be received at a PLC-side connector adapted for connection to the controller, and the second linearly ordered group can be provided to an I/O-side connector adapted for connection to the second termination puck. Since the second linearly ordered group has more lines than the remote subgroup, no connections are made to the extra lines in the second group.

Other aspects and advantages of the present invention will become apparent from the following detailed description, taken in conjunction with the accompanying drawings, which illustrate by way of example the principles of the invention.

BRIEF DESCRIPTION OF THE DRAWINGS

FIGS. 6A–6C are schematic representations of exemplary distributed input/output line interconnection schemes for an automated tool using the chainable termination puck of FIG. 1.

DESCRIPTION OF THE PREFERRED EMBODIMENT

Figure 1:
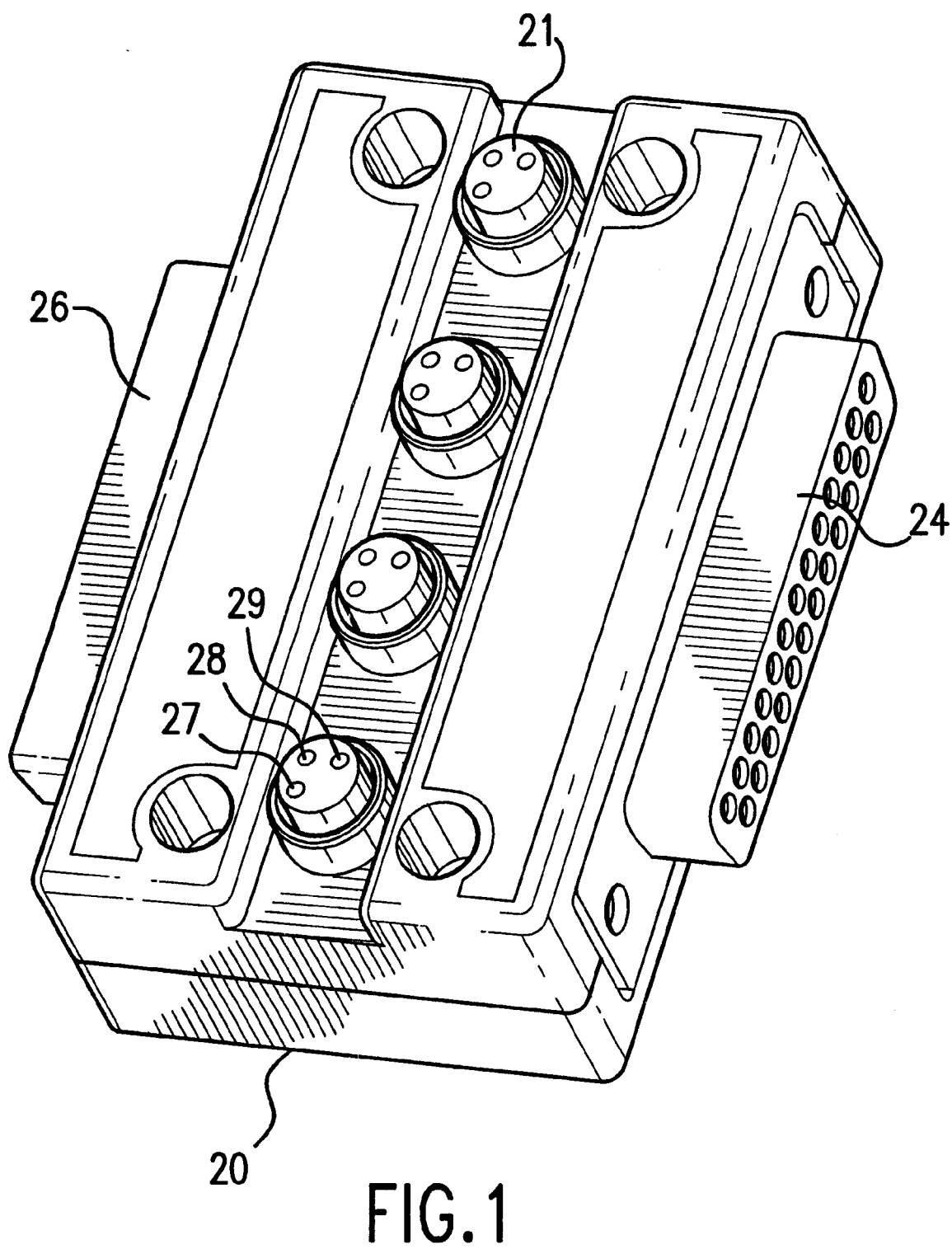
FIG. 1 is a perspective view of a chainable termination puck, also referred to as a chainable termination block, according to the present invention.
Figure 2:
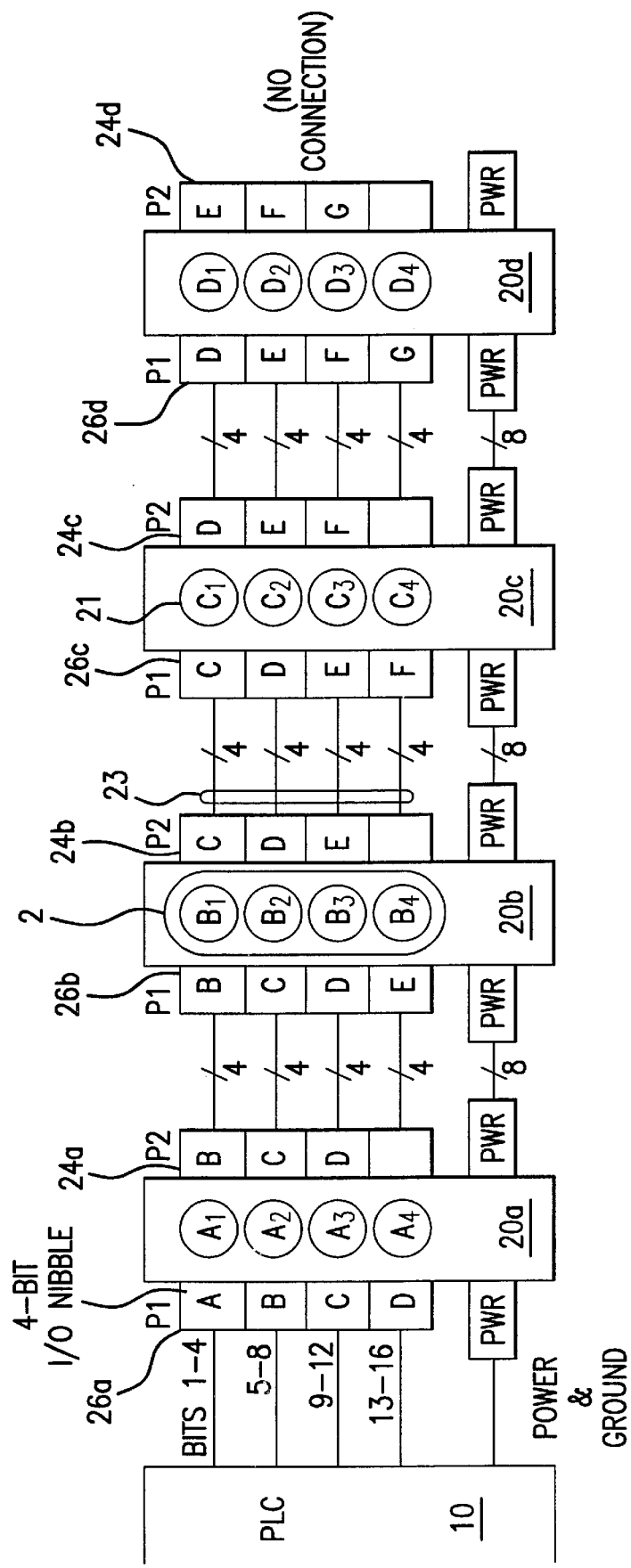
FIG. 2 is a schematic diagram of exemplary electrical chaining interconnections between a programmable logic controller and four chainable termination pucks of FIG. 1, illustrating the automatic shifting of the input/output line groups between two chaining connectors on each termination pucks when the pucks are chained together.

Referring now to the drawings, and more particularly to FIGS. 1 and 2, there is illustrated a chainable input/output (I/O) termination puck 20 constructed in accordance with the present invention which provides a robust, distributed, and convenient wiring system for connecting sensors and other input/output devices to a programmable logic controller (PLC) 10 or other types of computers or controllers. A number of pucks 20, such as pucks 20a–d, can be electrically chained together and connected to the PLC 10. Each puck 20 includes one or more termination connectors 21 for making connections to a corresponding one or more input/output devices, an I/O-side chaining connector 24, and a PLC-side chaining connector 26.

Each termination connector 21 is preferably an 8 millimeter DIN connector having three female pins for carrying electrical signals. A first pin 27 provides a power source 32 to the I/O device. A second pin 28 connects to the signal input or output of the I/O device. A third pin 29 provides a reference voltage (ground) 31 to the I/O device. The preferred embodiment of the puck 20 has four termination connectors 21, although the invention is usable with pucks having different numbers of connectors 21, and pucks with different numbers of termination connectors 21 can be chained together. The second pins 28 of the set of termination connectors 21 on a puck 20 collectively provide local signal lines 2. As will be discussed subsequently, the pucks 20 have internal wiring which route the local signal lines 2 to pins on the PLC-side chaining connector 26.

Each I/O-side chaining connector 24, such as connectors 24a–d for the corresponding pucks 20a–d, is preferably a 25-pin female D-subminiature connector which can be used to electrically chain a puck (such as puck 20b) to a subsequent puck (such as puck 20c) farther down the chain (i.e., away from the PLC 10). The I/O-side connector 24b has pins for connecting to remote signals 23 from the subsequent puck 20c. The I/O-side chaining connector 24b can be directly plugged into the PLC-side chaining connector 26c, or a cable assembly can be used to interconnect the I/O-side 24b and PLC-side 26c connectors.

Each PLC-side chaining connector 26, such as connectors 26a–d for the corresponding pucks 20a–d, is preferably a 25-pin male D-subminiature connector which is usable to electrically chain the puck 20b to a previous puck 20a located nearer to the PLC 10 in the chain. The PLC-side connector 26b can be directly plugged into the I/O-side connector 24a, or a cable assembly can be used to interconnect the I/O-side 24a and PLC-side 26b connectors. Alternatively, the PLC-side connector 26 can be connected directly to the PLC 10 via a cable assembly, as is illustrated for connector 26a. Each PLC-side connector 26 has pins for connecting both the local signal lines 2 and the chained signals 23 of the I/O-side connector 24 to the previous puck 20 or to the PLC.

Figure 3:
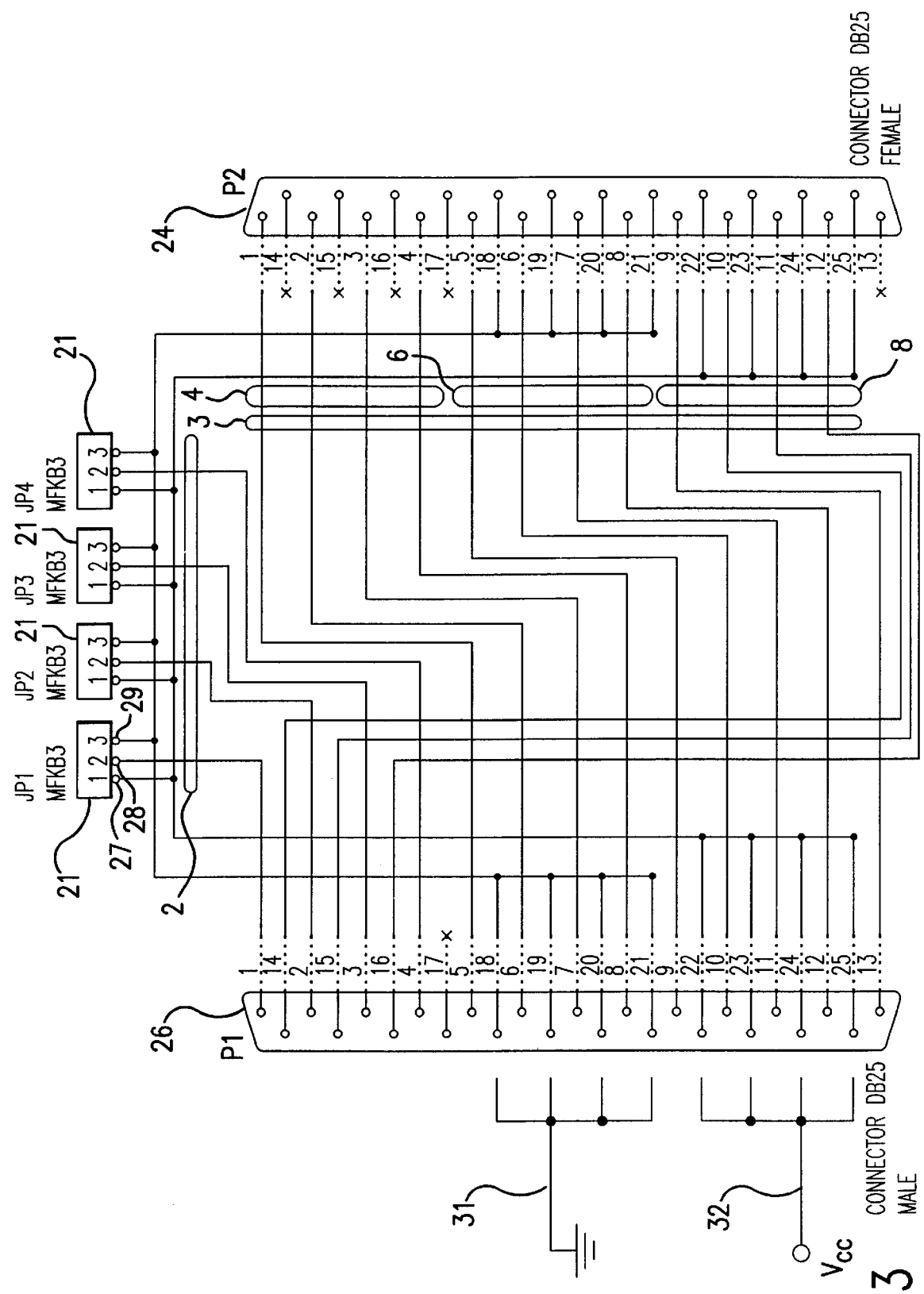
FIG. 3 is a schematic diagram of the internal electrical wiring of the chainable termination puck of FIG. 1.

Considering now the internal wiring of the pucks 20 that interconnects the local signal lines 2 and the chained signals 23 to the PLC-side connector 26, and as best understood with reference to FIGS. 2 and 3, chained signals 23 received at I/O side connector 24 are connected to remote signal lines 3 inside puck 20. The wiring of remote signal lines 3 is arranged such that the pin position on the PLC-side connector 26 of each individual one of the remote signal lines 3 is shifted from its corresponding position on the I/O-side connector by the number of signals contained in the local signal lines 2. The local signal lines 2 are then connected to the pins on the PLC-side connector 26 whose pin positions were vacated by the remote signal lines, resulting in a merged set of local and remote signal lines at the PLC-side connector 26. Because the number of chained signals 23 on both connectors 24, 26 is the same, some of the chained signals 23 present on I/O-side connector 24 are not passed through to PLC-side connector 26; the number of chained signals 23 omitted equals the number of local signal lines 2 in the puck 20. Expressed generally, for a group of N chained signals 23 applied to the I/O-side connector 24 and L local signal lines 2, N–L of the chained signals 23 will be connected to the PLC-side connector 26 along with the L local signal lines 2.

Considering now the remaining internal wiring connections of the puck 20, power and ground are supplied from the PLC 10 to the arrangement of chained pucks 20 via the PLC-side 26 and I/O-side 24 connectors. In the preferred embodiment, there are four power and four ground pins, located in the same pin positions on all connectors. Power and ground are supplied 20 to the sensors and other I/O devices via the first pin 27 and the third pin 29 of termination connector 21. Table I summarizes the wiring of the puck 20. The connector pin numbers are as illustrated on FIG. 3.

TABLE I

| Signals | Pin #s on I/O-side Connector 24 | Pin #s on PLC-side Connector 26 | Pin # on Termination Connectors 21 |
|---|---|---|---|
| Local Signals 2 | n/c | 1–4 | 2 |
| Remote Signals 3 | 1–12 | 5–16 | (no connection) |
| Power | 22–25 | 22–25 | 1 |
| Ground | 18–21 | 18–21 | 3 |

Considering now the programming interface between the PLC 10 and I/O devices connected to a chain of pucks 20, and as best understood with reference to the exemplary system configuration of FIG. 2 having four pucks 20a–20d each providing four termination connectors, the puck 20a is typically connected to PLC 10 via a cable with flying leads. This flying lead cable defines which pins on the PLC-side connector 26a of puck 20a are connected to which programmable I/O signals on the PLC 10. The chain of connections between pucks 20a–20d determines which termination connectors' signals appear on which pins of PLC-side connector 26a for communication with the PLC 10. The four local signals A1–A4 of puck 20a are connected to bits #1 through #4. The four local signals B1–B4 of puck 20b are shifted four bit positions as they chain through puck 20a, and thus are connected to bits #5 through #8. The programmatic effect to insert the local signals A1–A4 into the set of remote signals, bit-shift the chained remote signals 23, and eliminate four chained remote signals which originated from the furthest location in the chain.

Similarly, local signals C1–C4 of puck 20c are connected to bits #9 through #12 of PLC 10, and local signals D1–D4 of puck 20d are connected to bits #13 through #16 of PLC 10. In the preferred embodiment, which uses a 25-pin connector to chain sixteen lines of I/O signals, local signals of any additional pucks connected to the I/O-side connector 24d of puck 20d, such as those represented by chained signals E, F, and G, will not be connected to the PLC 10. Pucks 20 having other numbers of termination connectors 21, such as two or eight, can also be connected together in the same chain with pucks 20 having four connectors 21. To fully utilize the programmable I/O signals on the PLC 10, each puck 20 will preferably bit-shift the chained signals 23 it receives on its I/O-side connector 24 by the same number of bits as the number of termination connectors 21 on the puck 20. Expressed generally, for a group of N chained signals 23 applied to the I/O-side connector 24 and L local signal lines 2 on the puck 20, the N–L remote signal lines 3 connected to bit positions between 1 and N–L on the I/O-side connector 24 will be shifted by L bits to the corresponding bit position between L+1 and N on the PLC-side connector 26.

Considering now cable assemblies usable with the puck 20, eight millimeter cord sets compatible with termination connectors 21 are available from a variety of places, for example, from Turck, Inc., having a business address of 3000 Campus Drive, Minneapolis, Minn. 55441. These cord sets have a male DIN connector on one end and a female DIN connector on the other end. The cord sets are available in both straight and 90 degree orientations on the sensor end. The cord sets come in various lengths (e.g., 0.3 meters, 0.6 meters, 0.9 meters, 1.2 meters, 1.5 meters and 1.8 meters) which can be plugged together to make custom lengths. There is also available a termination connector 21 to Euro 0.5 meter adapter cable for sensors that have a 12 millimeter (Euro) connector. For valve termination, type "A" and "B" valve DIN connector cables are available, both in 0.6 meter and 0.9 meter lengths. In the preferred embodiment, puck 20 is capable of handling two amps total, and 500 milliamps per connector.

Figure 4:
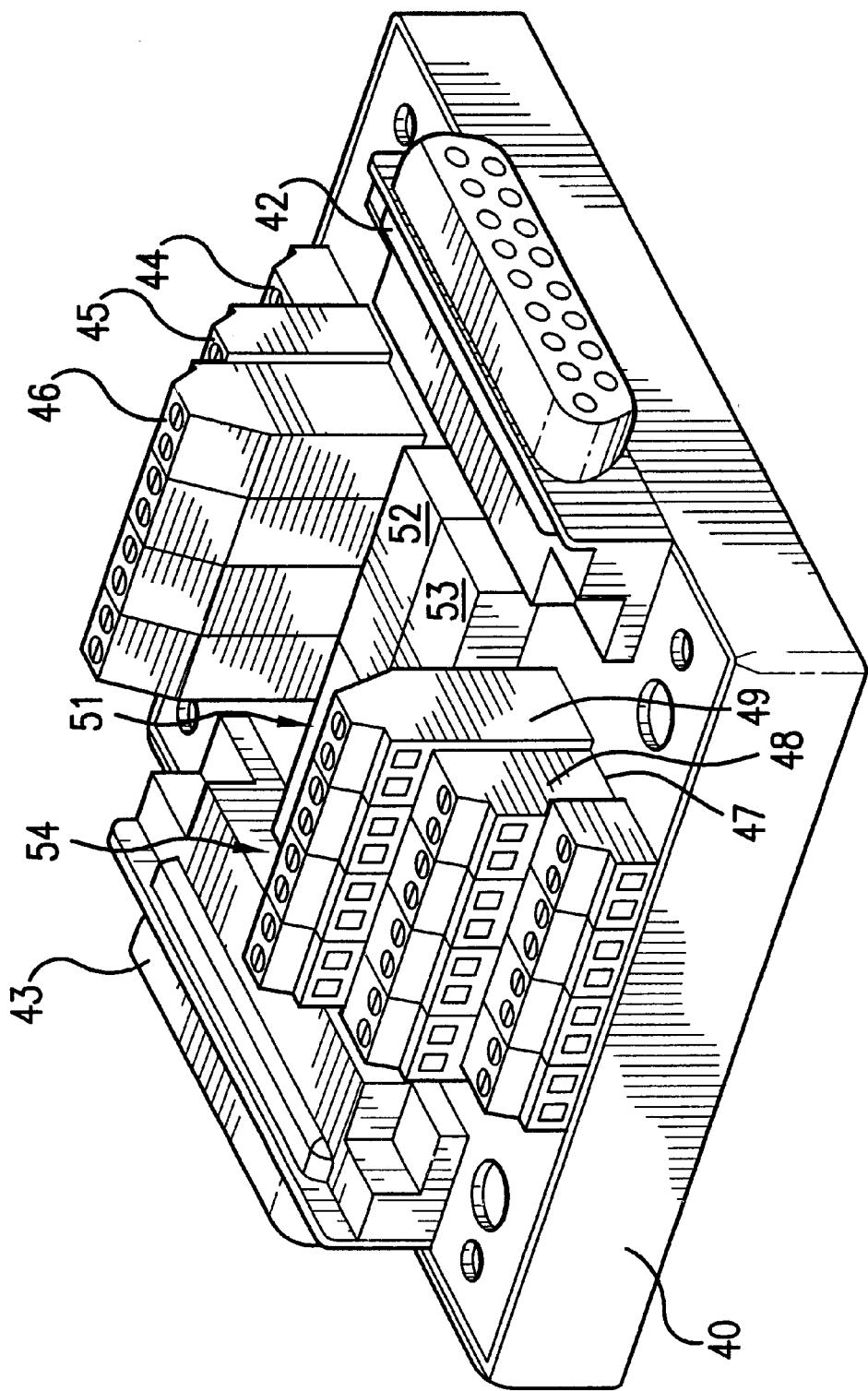
FIG. 4 is a perspective view of a flying-lead termination block, also referred to as a termination block puck, usable with the chainable termination block of FIG. 1.

Chainable pucks 20 are also usable in conjunction with a termination block puck (TBP) 40 illustrated in FIG. 4. TBP 40 can be utilized when pull-up/down resistors are used or when sensors with flying leads are used. Wire receptacles 44, 45, 46, 47, 48 and 49 are used to receive and secure wire leads to TBP 40. Wire receptacles 44 and 47 receive wire lines to be connected to ground. Wire receptacles 45 and 48 receive wire lines to be connected to power. Wire receptacles 46 and 49 receive wire lines to be connected to I/O devices. A connector 42 is a 25 pin female D-sub connector, which mates to PLC-side connector 26. Connector 42 is a 25 pin male D-sub connector which is used to connect TBP 40 to PLC 10 via a cable assembly. This allows TBP 40 to be connected to puck 20 and utilized only when necessary. When TBP 40 and puck 20 are used together, a DIP switch groups 51–54 are used to select for each I/O device whether a sensor cable is connected to a termination connector 21 of a puck 20 in the chain, or whether a wire connection is made to TBP 40 instead.

Figure 5:
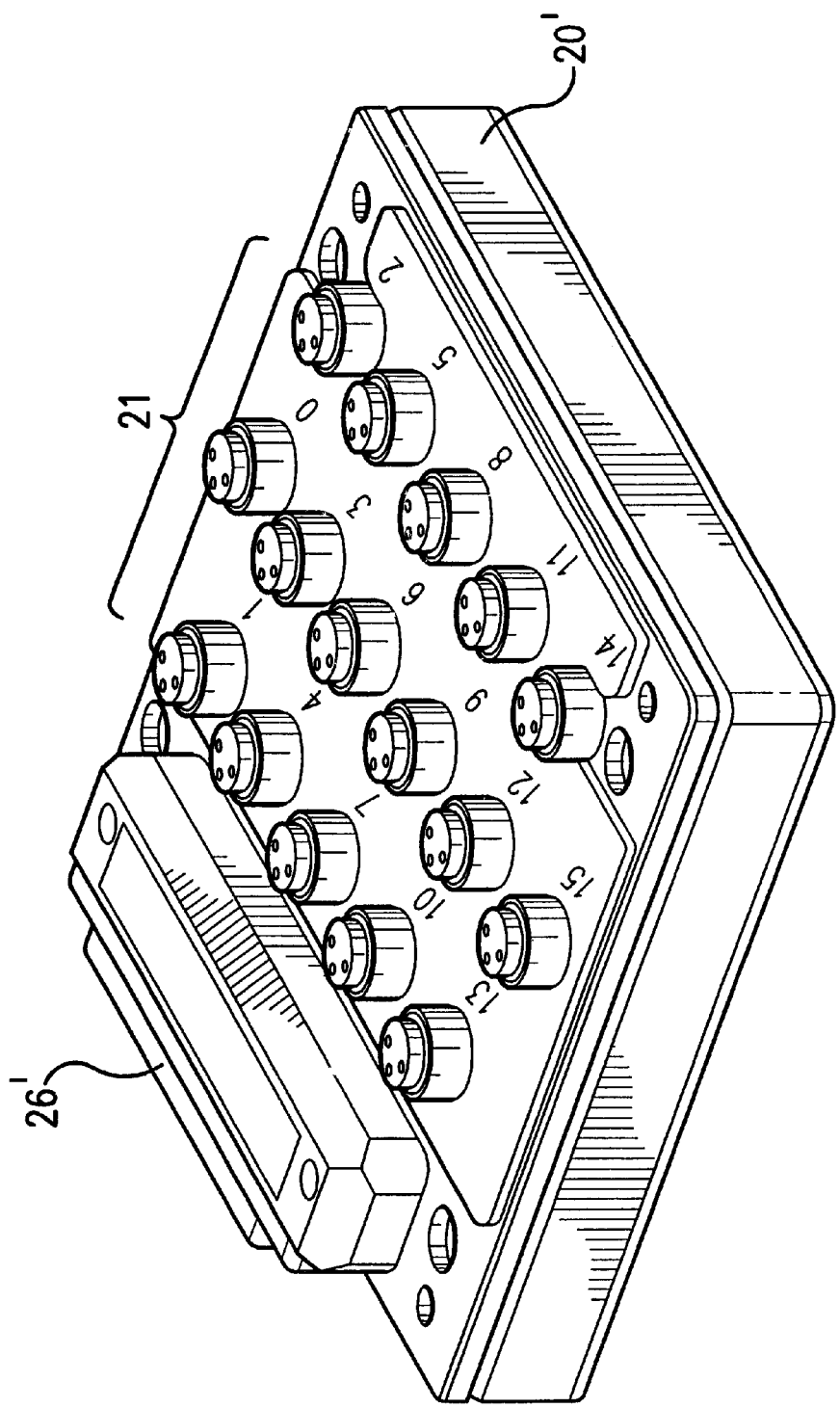
FIG. 5 is a perspective view of a non-chainable termination puck usable with the chainable termination puck of FIG. 1.

Chainable pucks 20 can replace or be used in conjunction with the non-chainable puck 20' of FIG. 5. Non-chainable puck 20' has a plurality of termination connectors 21' identical to connectors 21 of chainable puck 20, and a PLC-side connector 26' identical to PLC-side connector 26 of chainable puck 20. Input/output signals, power, and ground are provided at the same pins of connector 26' of non-chainable puck 20' as of connector 26 of chainable puck 20. As a result, non-chainable puck 20' can be used at the end of a chain of chainable pucks 20, and one or more chainable puck 20 can replace non-chainable puck 20' in a PLC system.

Figure 6C:
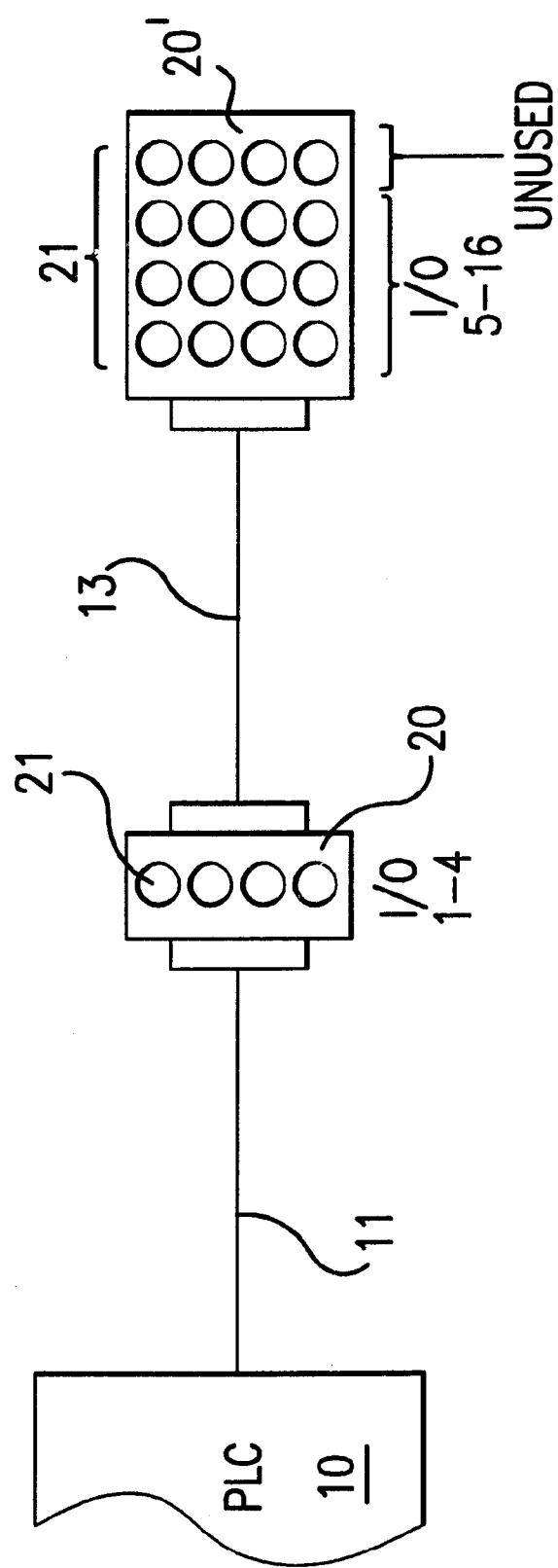

The chainable pucks 20 according to the present invention can be interconnected with each other, with a non-chainable puck 20', and with a termination block puck 40 in a variety of different ways so as to form modular termination systems, as illustrated in the exemplary schematic diagrams of FIGS. 6A–6C. FIG. 6A shows a PLC 10 connected by a flying-lead cable to a first puck 20a having termination connectors 21 for I/O signals #1–#4. A cable assembly 13 having a 25-pin D-subminiature cable on each end connects pucks 20a–20b, thus allowing them to be located at a distance from each other as the wiring to the tool bays require. Pucks 20b–20c are directly plugged together without use of a cable, then pucks 20c–20d are connected using another cable assembly 13. A total of 16 I/O connections are thus presented to the PLC 10.

FIG. 6B illustrates a second exemplary modular termination system using a termination block puck 40 with chainable puck 20a–20b. Chainable puck 20a is directly plugged into termination block 40 without the use of a cable. The two pucks 20a–20b present a total of 8 I/O connections to the PLC 10; other I/O connections can be made via flying-lead connections to the termination block puck 40 using cable 15.

FIG. 6C illustrates a third exemplary modular termination system using a non-chainable puck 20' with chainable puck 20. Puck 20 provides four termination connectors 21 for I/O signals #1–#4, while non-chainable puck 20' provides sixteen termination connectors 21 for I/O signals #5–#16. I/O signals for four of the termination connectors 21 on non-chainable puck 20' will not be transmitted through the flying-lead cable 11 to PLC 10 due to the bit-shifting operation and sixteen-signal capacity of chainable puck 20.

Figure 7:
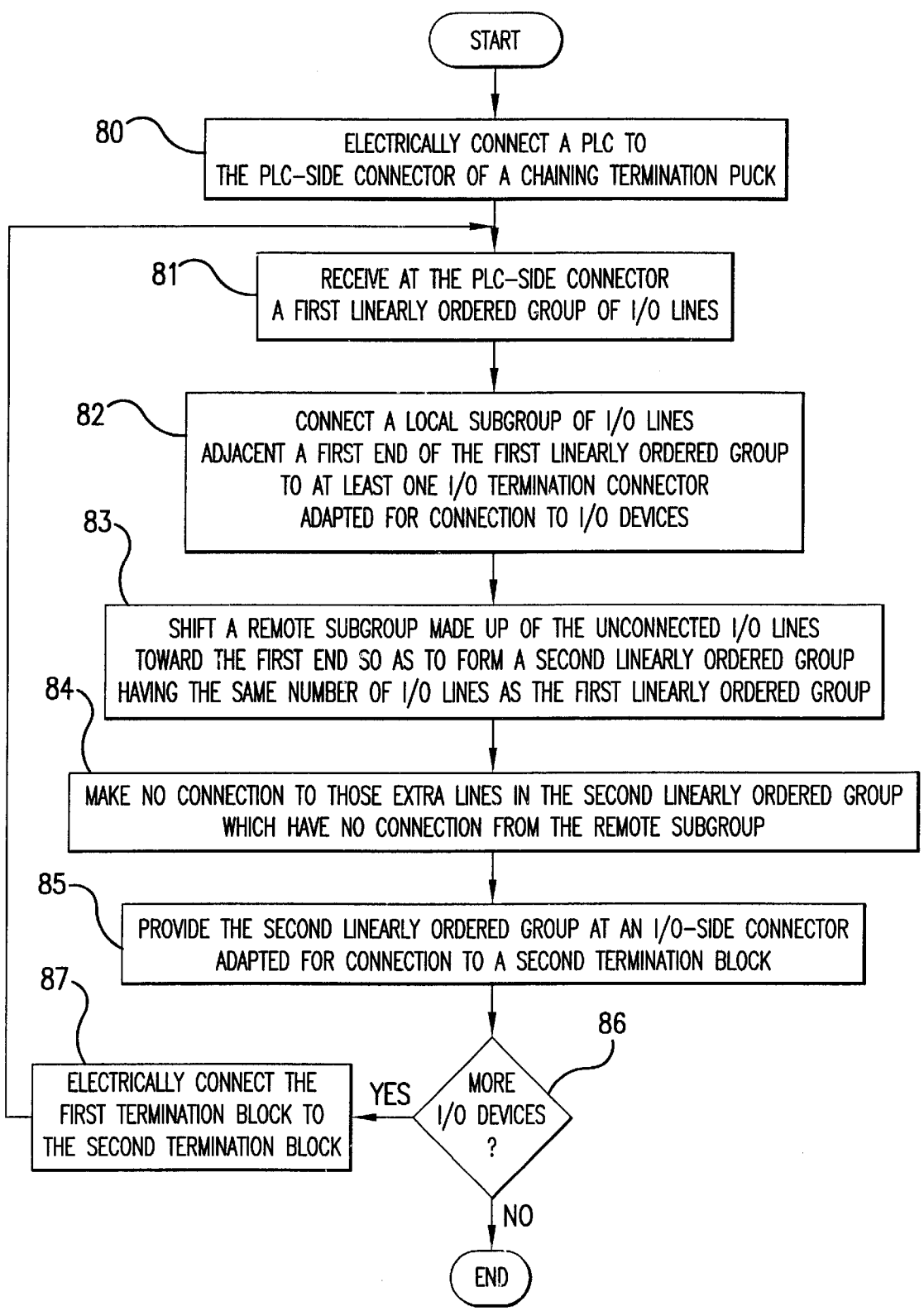
FIG. 7 is a flowchart of a method for distributing input/output lines from a programmable logic controller or other control device to input/output devices using the chainable termination puck of FIG. 1.
Figure 8:
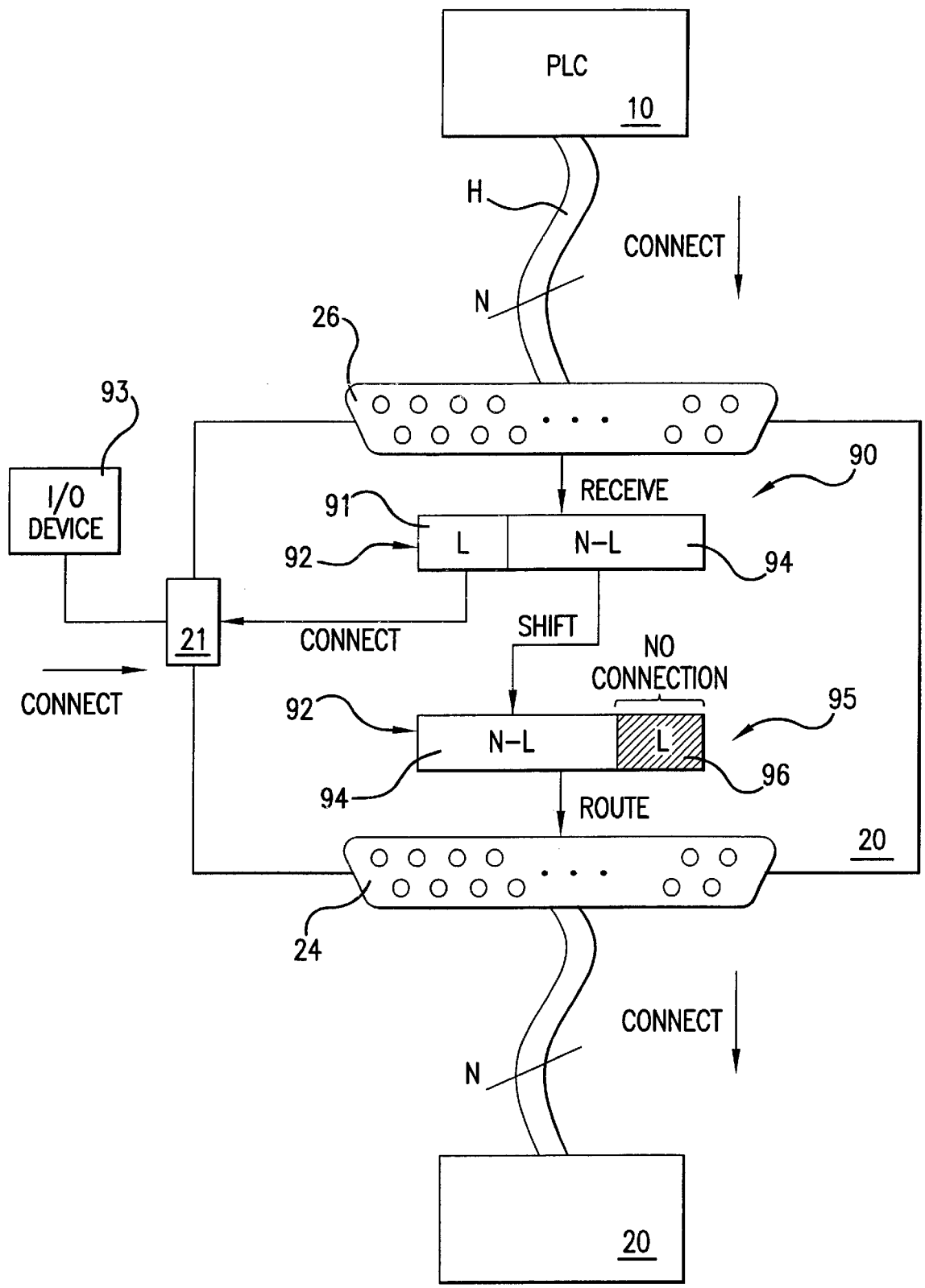
FIG. 8 is a schematic representation of the operation of the flowchart of FIG. 7.

The present invention may also be implemented as a novel method for distributing linearly ordered group of input/output lines from a controller to input/output devices. As best understood with reference to FIGS. 7 and 8, the method begins with a block 80 which electrically connects a PLC 10 to the PLC-side connector 26 of a chaining termination puck 20. Typically a cable 11 capable of carrying N signals is used for this connection. At 81, the puck 20 receives at the PLC-side connector 26 a first linearly ordered group of I/O lines 90. At 82, a local subgroup 91 of (L) I/O lines adjacent a first end 92 of the first linearly ordered group 90 is connected to at least one I/O termination connector 21 adapted for connection to I/O devices 93. At 83, a remote subgroup 94 made up of the (N–L) unconnected I/O lines is shifted toward the first end 92 so as to form a second linearly ordered group 95 having the same number of I/O lines as the first linearly ordered group 90. At 84, no connection is made to those (L) extra lines 96 in the second linearly ordered group 95 which have no connection from the remote subgroup. At 85, the second linearly ordered group 95 is provided at an I/O-side connector 24 which is adapted for connection to a second termination block 20. If there are no more I/O devices to connect ("No" branch of 86), the method ends. If there are more I/O devices to connect ("Yes" branch of 86), the second termination block 20 is electrically connected to the first termination block, and the method continues at 81.

From the foregoing it will be appreciated that the chaining I/O termination apparatus and methods provided by the present invention represent a significant advance in the art. Although several specific embodiments of the invention have been described and illustrated, the invention is not to be limited to the specific methods, forms, or arrangements of parts so described and illustrated. In particular, the invention has application beyond the field of automated tooling, and may be used, for instance, in general purpose data acquisition systems and in automated electronic test equipment. The invention is limited only by the claims.

What is claimed is:

1. A termination system for an automated tooling arrangement comprising:
    at least one chainable termination puck, each chainable termination puck including
        a plurality of termination connectors, each termination connector having a tool power line, a tool ground line, and a local signal line,
        a first chaining connector having a plurality of remote signal lines, at least one power line, and at least one ground line in a first arrangement, the at least one power line connected to each tool power line and the at least one ground line connected to each tool ground line, and
        a second chaining connector electrically connected to the at least one power line, the at least one ground line, and the pluralities of remote signal lines and local signal lines in a second arrangement in which the remote signal lines are shifted in position on the second chaining connector relative to the first chaining connector by the number of local signal lines, and replaced in position by the local signal lines, and in which the at least one power line and the at least one ground line are located in the same position on the second chaining connector as on the first chaining connector.

2. The termination system of claim 1, wherein the second chaining connector is electrically engageable with the first chaining connector of an additional chainable termination puck.

3. The termination system of claim 2, further comprising:
    an additional chainable termination puck electrically engaged with the at least one termination puck.

4. The termination system of claim 3, wherein the first chaining connector of an individual one of the at least one chainable termination puck is mechanically mated with the second chaining connector of the additional chainable termination puck so as to electrically engage the chainable termination pucks.

5. The termination system of claim 3, further comprising:
    an electrical cable connected between the first chaining connector of an individual one of the at least one chainable termination puck and the second chaining connector of the additional chainable termination puck so as to electrically engage the chainable termination pucks.

6. The termination system of claim 1 wherein the termination connector is a DIN connector.

7. The termination system of claim 1 wherein the first and second chaining connectors are the same type of connector with the same number of pins but a different gender.

8. The termination system of claim 1 wherein the first chaining connector is a 25 pin female D-sub connector, and the second chaining connector is a 25 pin male D-sub connector.

9. The termination system of claim 1, further comprising:
    a second termination puck including:
        a first main connector electrically connected to the second chaining connector of one of the at least one chainable termination puck,
        a plurality of second connectors having a type different from the termination connectors,
        a second main connector, and
        a plurality of switches, each switch for selecting either a line from the first main connector or a line from one of the plurality of second connectors to be electrically connected to a line of the second main connector.

10. The termination system of claim 2, wherein the local signal line of each termination connector is one signal line.

11. The termination system of claim 2, wherein the electrical engagement interconnects each individual line on the second chaining connector with a corresponding line having the same position on the first chaining connector of the additional chainable termination puck.

12. The termination system of claim 3, in which the at least one chainable termination puck and the additional chainable termination puck have a different number of termination connectors.

13. The termination system of claim 1, in which each local signal line is adapted to connect to an input/output point of the automated tooling arrangement.

14. A termination system for an automated tooling arrangement, comprising:
    at least one chainable termination puck, the at least one chainable termination puck including:
        a plurality of termination connectors, each termination connector being of a first type of connector and having a local signal line, a first chaining connector having a plurality of remote signal lines, and a second chaining connector, the second chaining connector being electrically connected to each termination connector within the plurality of termination connectors and further electrically connected to a subset of the plurality of remote signal lines; and a second termination puck, the second termination puck including:

a first main connector, the first main connector being electrically connected to the second chaining connector of one of the at least one chainable termination pucks, a plurality of second connectors, the second connectors being of a second type of connector, the second type being different than the first type, a second main connector, and a plurality of switches, each switch for selecting either a control/sensor pin from the first main connector or a control/sensor pin from one of the second connectors within the plurality of second connectors to be electrically connected to a control/sensor pin of the second main connector.

15. The termination system of claim 14, further comprising:

an electrical cable connected between the first main connector of the second termination puck and the second chaining connector of the one of the at least one chainable termination pucks so as to provide an electrical connection.

16. The termination system of claim 14 wherein each termination connector is a DIN connector.

17. The termination system of claim 14 wherein each first chaining connector is a 25 pin female D-sub connector, wherein each second chaining connector is a 25 pin male D-sub connector, and wherein the first main connector is a 25 pin female D-sub connector.

* * * * *